United States Patent
Fan et al.

(10) Patent No.: US 6,700,419 B1
(45) Date of Patent: Mar. 2, 2004

(54) DRIVING CIRCUIT FOR HIGH FREQUENCY SIGNAL

(75) Inventors: Hung-Cheng Fan, Taoyuan (TW); Pang Cheng Yu, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/387,499

(22) Filed: Mar. 14, 2003

(51) Int. Cl.[7] .................................................. H03K 3/00
(52) U.S. Cl. ........................................ 327/108; 327/112
(58) Field of Search ......................... 327/108–112, 170, 327/436, 437

(56) References Cited

U.S. PATENT DOCUMENTS 6,384,675 B1 * 5/2002 Ang et al. .................. 327/562

* cited by examiner

Primary Examiner—Kenneth B. Wells

(74) Attorney, Agent, or Firm—Rabin & Berdo, P.C.

(57) ABSTRACT

A driving circuit for outputting high-frequency signal. The first NMOS transistor includes a first drain coupled to a first voltage level, a first gate coupled to the output terminal of the first operational amplifier and a first source coupled to the input terminal of the first operational amplifier. The first PMOS transistor includes a second drain coupled to a second voltage level, a second gate coupled to the output terminal of the second operational amplifier and a second source coupled to the input terminal of the second operational amplifier. The matching resistor having a predetermined resistance is coupled between the first source and the second source. The second NMOS transistor includes a third drain coupled to the first voltage level, a third gate coupled to the output terminal of the first operational amplifier and a third source. The second PMOS transistor includes a fourth drain coupled to the second voltage level, a fourth gate coupled to the output terminal of the second operational amplifier and a fourth source. The output resistor includes a first terminal, a second terminal and the predetermined resistance. The switching device connects the first terminal and the third source and the second terminal and the fourth source or connecting the first terminal and the fourth source and the second terminal and the third source.

10 Claims, 3 Drawing Sheets

DRIVING CIRCUIT FOR HIGH FREQUENCY SIGNAL

BACKGROUND OF THE INVENTION

1. Field of the Invention

The present invention relates in general to a driving circuit. In particular, the present invention relates to a driving circuit operated in voltage switching mode to output high frequency signals.

2. Description of the Related Art

FIG. 1 shows a conventional driving circuit. The source of the PMOS transistor P10 is connected to the current source 10, the drain of the PMOS transistor P10 is connected to the NMOS transistor N10 and the source of the NMOS transistor N10 is connected to the current source 12. The gates of the PMOS transistor P10 and the NMOS transistor N10 are connected to the inverse input terminal DN. In addition, the source of the PMOS transistor P12 is connected to the current source 10, the drain of the PMOS transistor P10 is connected to the NMOS transistor N12 and the source of the NMOS transistor N12 is connected to the current source 12. The gates of the PMOS transistor P12 and the NMOS transistor N12 are connected to the input terminal D. The output resistor 14 includes terminals Q and QN, connected to the connection point of the drains of the PMOS transistor P10 and the NMOS transistor N10 and the connection point of the drains of the PMOS transistor P12 and the NMOS transistor N12, respectively. The voltage of the terminals Q and QN are both input to the first input terminal of the comparator 16 through resistors 15A and 15B having the same resistance, respectively. Thus, the voltage level of the first input terminal is half of the addition of the voltage of the terminals Q and QN. The comparator 16 compares the voltage at the first input terminal and a reference voltage VREF at the second input terminal and controls the current source 12 to make the half of the addition of the voltage of the terminals Q and QN equal to the reference voltage VREF. Thus, the voltages at the terminals Q and QN are fixed.

The conventional driving circuit shown in FIG. 1 is operated in current switch mode with common mode feedback. Here, the voltage level of the terminals DN and D are inverted. That is, when the terminal D receives a high level signal, the terminal DN receives a low level signal at the same time. Thus, the PMOS transistor P10 and the NMOS transistor N12 are turned on and the PMOS transistor P12 and the NMOS transistor N10 are turned off. Therefore, current flows through the resistor 14 from the terminal Q to the terminal QN, and constant voltage difference between the terminals Q and QN is generated and the voltage level at the terminals Q and QN is controlled by the comparator 16, wherein the comparator 16 is an operational amplifier. Conversely, when the terminal D receives a low level signal, the terminal DN receives a high level signal at the same time. Thus, the PMOS transistor P12 and the NMOS transistor N10 are turned on and the PMOS transistor P10 and the NMOS transistor N12 are turned off. Therefore, current flows through the resistor 14 from the terminal QN to the terminal Q, and the constant voltage difference between the terminals Q and QN is generated and the voltage level at the terminals Q and QN is controlled by the comparator 16.

The voltage level at the terminals Q and QN is controlled by the comparator 16 to reach demand values when the signals provided to the terminals DN and D are in low frequency.

However, the voltage difference between the terminals DN and D is low because the current is fixed when data is transmitted at high frequency.

SUMMARY OF THE INVENTION

The object of the present invention is thus to provide a driving circuit operating at high speed. In addition, the driving circuit provides output signal with fixed voltage difference and adjustable boundary.

To achieve the above-mentioned object, the present invention provides a driving circuit for outputting high-frequency signal. The first operational amplifier includes a first first input terminal coupled to a first reference voltage, a first second input terminal and a first output terminal. The second operational amplifier includes a second first input terminal coupled to a second reference voltage, a second second input terminal and a second output terminal. The first first-type MOS transistor includes a first drain coupled to a first voltage level, a first gate coupled to the first output terminal and a first source coupled to the first second input terminal. The first second-type MOS transistor includes a second drain coupled to a second voltage level, a second gate coupled to the second output terminal and a second source coupled to the second second input terminal. The matching resistor having a predetermined resistance is coupled between the first source and the second source. The second first-type MOS transistor includes a third drain coupled to the first voltage level, and a third gate coupled to the first output terminal and a third source. The second second-type MOS transistor includes a fourth drain coupled to the second voltage level, a fourth gate coupled to the second output terminal and a fourth source. The output resistor includes a first terminal, a second terminal and the predetermined resistance. The switching device connects the first terminal and the third source and the second terminal and the fourth source or connecting the first terminal and the fourth source and the second terminal and the third source.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
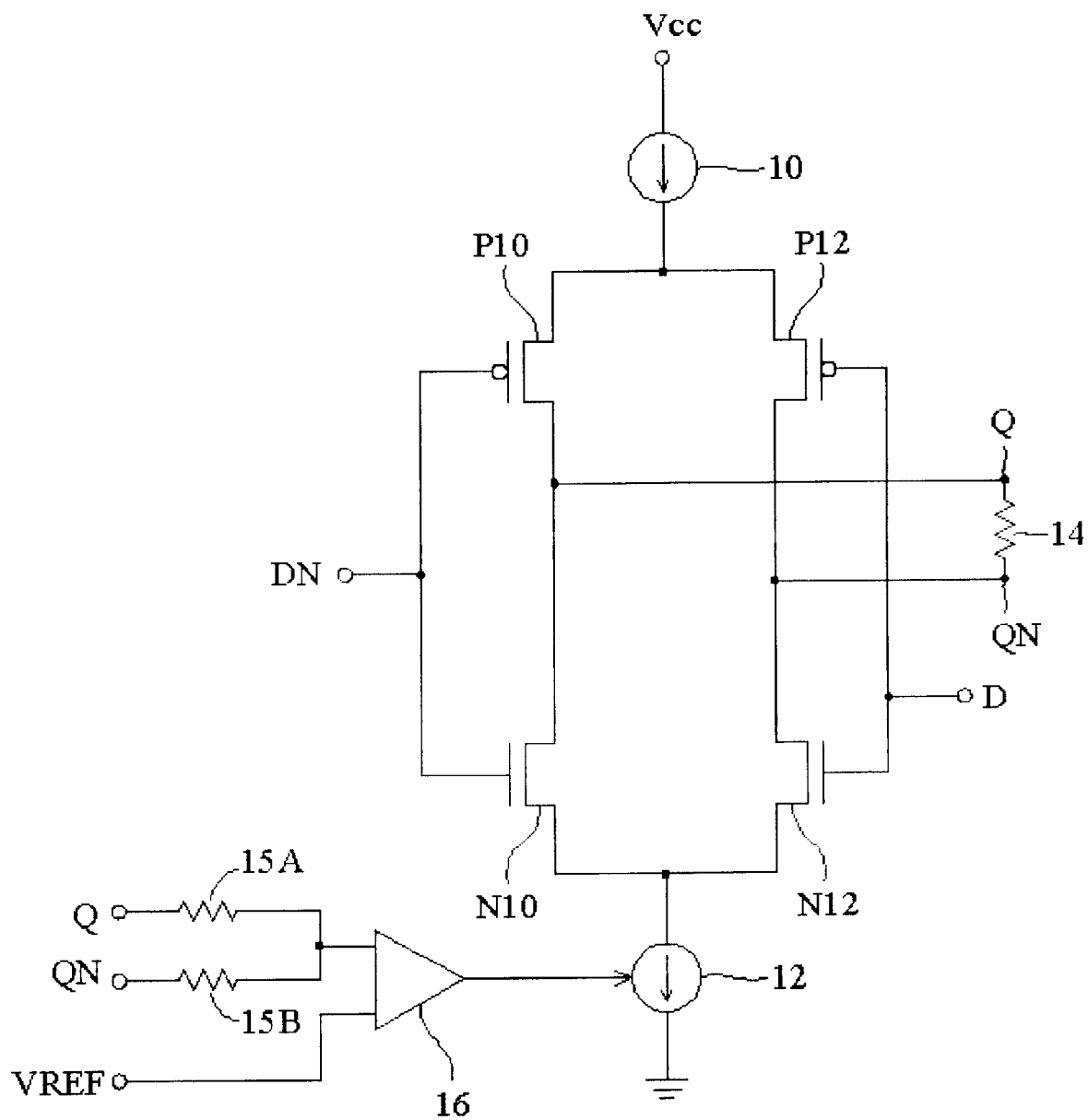
FIG. 1 shows a conventional driving circuit.
Figure 2A:
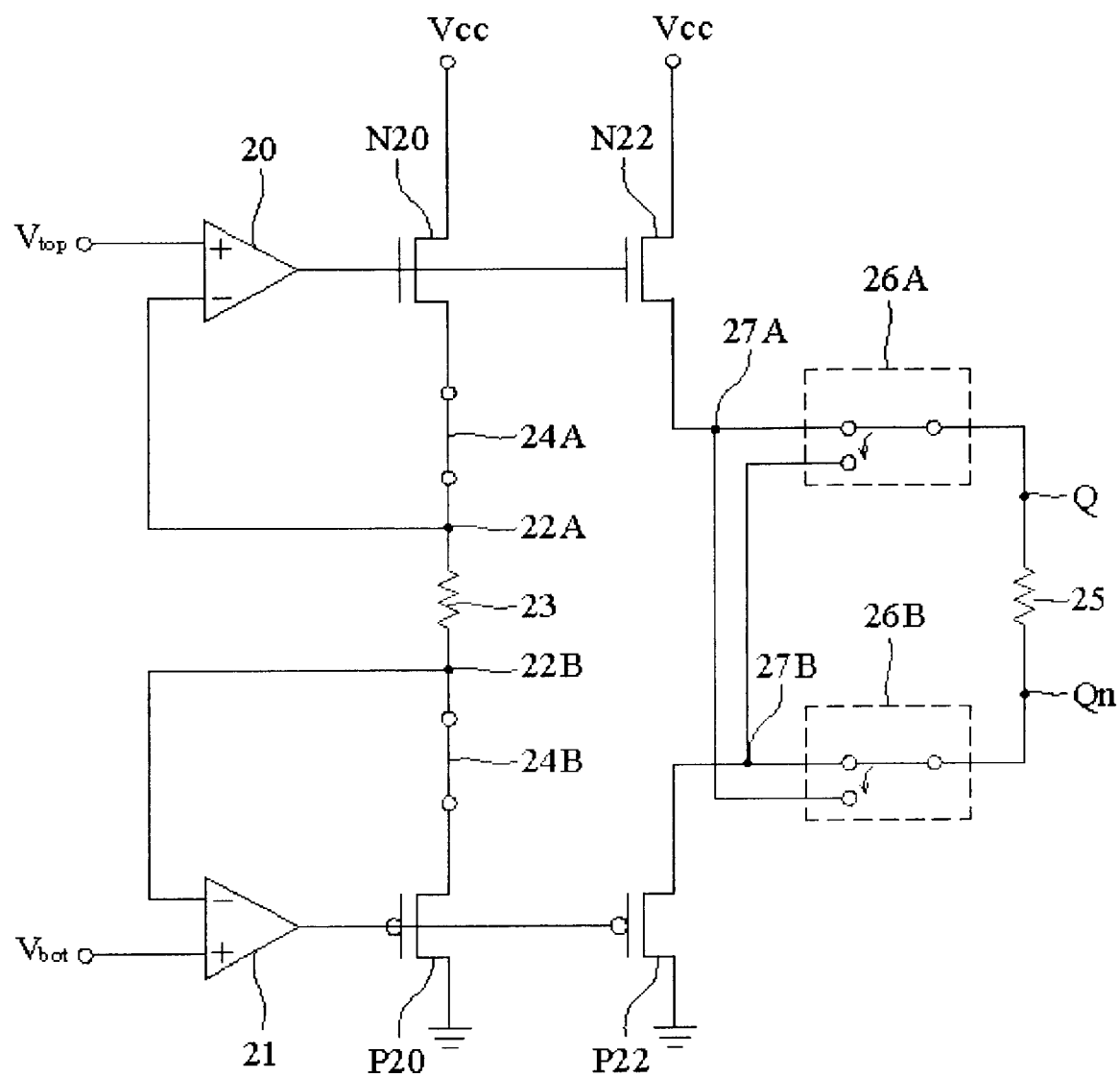
FIG. 2A shows the driving circuit according to the embodiment of the present invention.

FIG. 2A shows the driving circuit according to the first embodiment of the present invention. The operational amplifiers 20 and 21 comprise a non-reverse input terminal, a reverse input terminal and an output terminal, respectively. The non-reverse input terminals of the operational amplifiers 20 and 21 receive reference voltages Vtop and Vbot, respectively. The gate of the MOS transistor N20 is connected to the output terminal of the operational amplifier 20, the drain of the NMOS transistor N20 is connected to the power source Vcc and the source of the NMOS transistor N20 is connected to the switches 24A.

The gate of the PMOS transistor P20 is connected to the output terminal of the operational amplifier 21, the drain of the PMOS transistor P20 is connected to ground and the source of the PMOS transistor P20 is connected to the reverse input terminal of the operational amplifier 21. The connection point of the source of the PMOS transistor P20 and the reverse input terminal of the operational amplifier 21 is labeled 22B. The connection point of the source of the NMOS transistor N20 and the reverse input terminal of the operational amplifier 20 is labeled 22A.

The resistor 23 having a predetermined resistance is connected between the always turned on switches 24A and 24B. In addition, the connection point of the resistor 23 add the reverse input terminal of the operational amplifier 20 is labeled 22A and the connection point of the resistor 23 and the reverse input terminal of the operational amplifier 21 is labeled 22B. The effect of the switches 24A and 24B is described below.

The gate of the NMOS transistor N22 is connected to the output terminal of the operational amplifier 20 and the drain of the NMOS transistor N22 is connected to the power source Vcc. The gate of the PMOS transistor P22 is connected to the output terminal of the operational amplifier 21 and the drain of the PMOS transistor P22 is connected to ground. In the present invention, the sizes of the NMOS transistors N20 and N22 are the same, as are those of the PMOS transistors P20 and P22.

One terminal Q of the resistor 25 is selectively connected to the source of the NMOS transistor N22 or the PMOS transistor P22 by the switching of the switch 26A and another terminal Qn of the resistor 25 is selectively connected to the source of the PMOS transistor P22 or the NMOS transistor N22 by the switching of the switch 26B. The connection point of the terminal Q and the NMOS transistor N22 is labeled 27A and the connection point of the terminal Qn and the PMOS transistor P22 is labeled 27B.

Here, the resistor 25 has a predetermined resistance the same as the resistor 23. The switches 26A and 26B are switching at the same time. That is, when the switch 26A connects the resistor 25 and the connection point 27A, the switch 26B must connect the resistor 25 and the connection point 27B. On the contrarily, when the switch 26A connects the resistor 25 and the connection point 27B, the switch 26B must connect the resistor 25 and the connection point 27A. Here, the switches 24A, 24B, 26A and 27B are the same electronic element, such as transmission gates.

The operational amplifiers 20 and 21 turn on the NMOS transistors N20 and N22 and the PMOS transistors P20 and P22. Thus, the voltage level of the connection point 22A is equal to the reference voltage Vtop because the non-reverse input terminal and the reverse input terminal of the operational amplifier 20 are virtually grounded. For the same reason, the voltage level of the connection point 22B is equal to the reference voltage Vbot. Thus, the current flows through the resistor 23 from the connection point 22A to the connection point 22B.

As mentioned above, the threshold Voltage (Vt), channel aspect ratio (W/L), transconductance (gm, the resistance between the source and the gate of the MOS transistor) and the bios condition of the NMOS transistors N20 and N22 are the same, and so as the PMOS transistors P20 and P22. Moreover, the resistance of the resistors 23 and 25 are also the same. Thus, when the switch 26A is connected to the connection point 27A and the switch 26B is connected to the connection point 27B, the voltage level of the connection point 27A and the reference voltage Vtop are the same and the voltage level of the connection point 27B and the reference voltage Vbot are also the same. Conversely, when the switch 26A is connected to the connection point 27B and the switch 26B is connected to the connection point 27A, the voltage level of the connection point 27A is the reference voltage Vbot and the voltage level of the connection point 27B is the reference voltage Vtop. Here, the terminals Q and Qn are the output terminal of the driving circuit, which outputs the signal having a constant voltage difference and having the voltage boundary at reference voltages Vtop and Vbot. By the simultaneous switching of the switches 26A and 26B, the voltage level of the terminals Q and Qn are switched to the reference voltages Vtop and Vbot alternately.

Figure 2B:
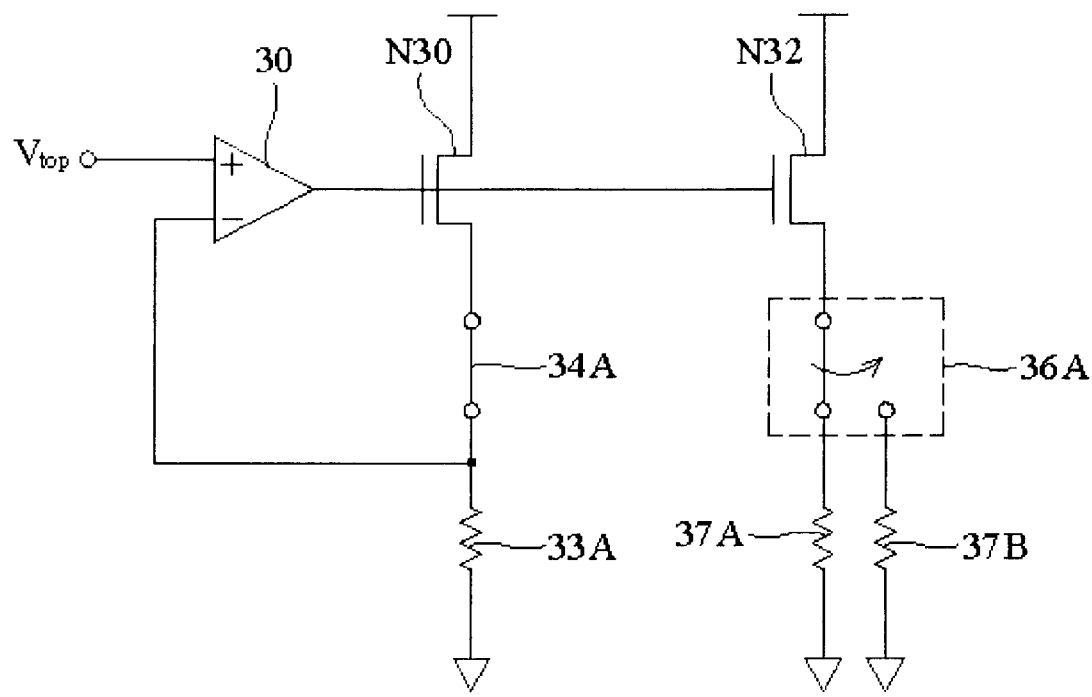
FIG. 2B shows a circuit similar to the top portion of the circuit shown in FIG. 2A.

FIG. 2B shows a circuit similar to the top portion of the circuit shown in FIG. 2A. The gates of the NMOS transistors N30 and N32 are connected to the output terminal of the operational amplifier 30, and the drains of the NMOS transistors N30 and N32 are connected to the power source Vcc. The non-reverse input terminal of the operational amplifier 30 receives the reference voltages Vtop. The source of the NMOS transistor N30 is connected to the switch 34A. The reverse input terminal of the operational amplifier 30 is connected to the other terminal of the switch 34A. One terminal of the resistor 33A is connected to the switch 34A, and the other terminal is connected to ground. Here, the resistor 34A is always turned on. In addition, one terminal of the switch 36A is connected to the source of the NMOS transistor N32 and selectively connected the resistors 37A and 37B. In addition, the other terminals of the resistors 37A and 37B are connected to ground, respectively. For the same reason as mentioned above, one of the terminals of the resistors 37A and 37B outputs the voltage level of the reference voltage Vtop when connects to the source of the NMOS transistor N32.

Figure 2C:
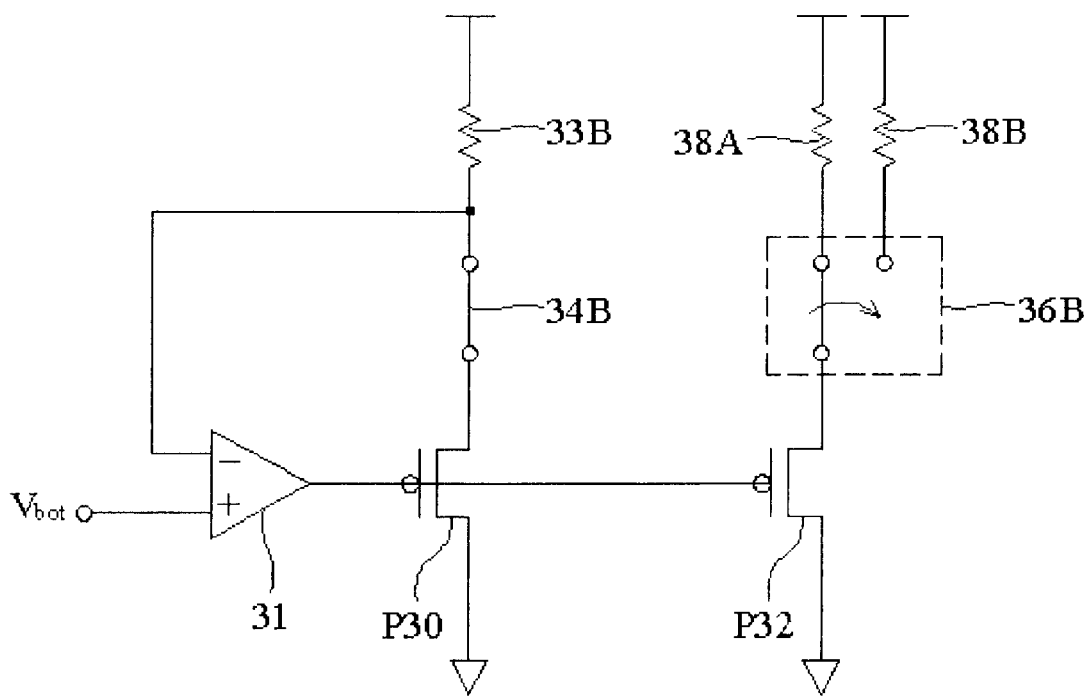
FIG. 2C shows a circuit similar to the bottom portion of the circuit shown in FIG. 2A.

FIG. 2C shows a circuit similar to the bottom portion of the circuit shown in FIG. 2A. The gates of the PMOS transistors P30 and P32 are connected to the output terminal of the operational amplifier 31, and the drains of the PMOS transistors P30 and P32 are connected to ground. The non-reverse input terminal of the operational amplifier 31 receives the reference voltages Vbot. The source of the PMOS transistor P30 is connected to the switch 34B. The reverse input terminal of the operational amplifier 30 is connected to the other terminal of the switch 34B. One terminal of the resistor 33B is connected to the switch 34B, and the other terminal is connected to the power source Vcc. Here, the resistor 34B is always turned on. In addition, one terminal of the switch 36B is connected to the source of the PMOS transistor P32 and selectively connected the resistors 38A and 38B. In addition, the other terminals of the resistors 38A and 38B are connected to the power source Vcc, respectively. For the same reason as mentioned above, one of the terminals of the resistors 38A and 38B outputs the voltage level of the reference voltage Vbot when connects to the source of the PMOS transistor P32.

The circuit of FIGS. 2B and 2C comprise the circuit of FIG. 2A. In FIG. 2A, the output of the driving circuit of the present invention uses source (or emitter) follows and output the output voltages of the terminals Q and Qn by switching the switches 27A and 27B, so the output impedance is low. In addition, the transient Vgs increases when data is changed, so the output of the driving circuit of the present invention can provide larger current and switch the output voltages of the terminals Q and Qn quickly. Moreover, the driving circuit according to the present invention uses the feedback circuit, the same as the output circuit, to generate the control voltages (reference voltages Vtop and Vbot) and make the output voltages of the terminals Q and Qn equal to the reference voltages Vtop and Vbot. Thus, the half of the output voltages of the terminals Q and Qn is also kept constant. Moreover, the voltage levels of the terminals Q and Qn are adjusted by changing the value of the reference voltages Vtop and Vbot. Thus, the driving circuit is suitable for providing several high frequency signals, for example, transition minimized differential signaling (TMDS), universal serial bus (USB), and low-voltage differential signaling (LVDS) signals. In addition, the transconductances (gm) of the NMOS transistor N22 and the PMOS transistor P22 are adjustable to achieve impedance match. In addition, the output of the driving circuit of the present invention use source (or emitter) follows, so the output voltage is more independent from the provided voltage.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A driving circuit for outputting high-frequency signal, comprising:
    a first operational amplifier having a first first input terminal coupled to a first reference voltage, a first second input terminal and a first output terminal;
    a second operational amplifier having a second first input terminal coupled to a second reference voltage, a second second input terminal and a second output terminal;
    a first first-type MOS transistor having a first drain coupled to a first voltage level, a first gate coupled to the first output terminal and a first source coupled to the first second input terminal;
    a first second-type MOS transistor having a second drain coupled to a second voltage level, a second gate coupled to the second output terminal and a second source coupled to the second second input terminal;
    a matching resistor having a predetermined resistance coupled between the first source and the second source;
    a second first-type MOS transistor having a third drain coupled to the first voltage level, a third gate coupled to the first output terminal and a third source;
    a second second-type MOS transistor having a fourth drain coupled to the second voltage level, a fourth gate coupled to the second output terminal and a fourth source;
    an output resistor having a first terminal, a second terminal and the predetermined resistance; and
    a switching device for connecting the first terminal and the third source and the second terminal and the fourth source or connecting the first terminal and the fourth source and the second terminal and the third source.

2. The driving circuit for outputting high-frequency signal as claimed in claim 1, wherein the size of the first first-type MOS transistor and the second first-type MOS transistor are the same.

3. The driving circuit for outputting high-frequency signal as claimed in claim 2, wherein the size of the second first-type MOS transistor and the second second-type MOS transistor are the same.

4. The driving circuit for outputting high-frequency signal as claimed in claim 1, wherein the first first-type MOS transistor and the second first-type MOS transistor are NMOS transistors.

5. The driving circuit for outputting high-frequency signal as claimed in claim 1, wherein the first second-type MOS transistor and the second second-type MOS transistor are PMOS transistors.

6. The driving circuit for outputting high-frequency signal as claimed in claim 1, wherein the switching device comprises:
    a first transmission gate coupled between the first terminal and the third source;
    a second transmission gate coupled between the first terminal and the fourth source;
    a third transmission gate coupled between the second terminal and the third source; and
    a fourth transmission gate coupled between the second terminal and the fourth source.

7. The driving circuit for outputting high-frequency signal as claimed in claim 6, wherein the first transmission gate and the third transmission gate are turned on at the same time.

8. The driving circuit for outputting high-frequency signal as claimed in claim 7, wherein the second transmission gate and the fourth transmission gate are turned on at the same time.

9. The driving circuit for outputting high-frequency signal as claimed in claim 1, further comprising an always turned on fifth transmission gate coupled between the matching resistor and the first source.

10. The driving circuit for outputting high-frequency signal as claimed in claim 1, further comprising an always turned on fifth transmission gate coupled between the matching resistor and the second source.

* * * * *